US012713529B2

(12) United States Patent
Tominaga

(10) Patent No.: US 12,713,529 B2
(45) Date of Patent: Aug. 18, 2026

(54) COMPONENT MOUNTING BOARD

(71) Applicant: MEKTEC CORPORATION, Tokyo (JP)

(72) Inventor: Azumi Tominaga, Tokyo (JP)

(73) Assignee: MEKTEC CORPORATION, Tokyo (JP)

(*) Notice: Subject to any disclaimer, the term of this patent is extended or adjusted under 35 U.S.C. 154(b) by 346 days.

(21) Appl. No.: 18/569,583

(22) PCT Filed: Oct. 5, 2022

(86) PCT No.: PCT/JP2022/037293
§ 371 (c)(1),
(2) Date: Dec. 12, 2023

(87) PCT Pub. No.: WO2023/162319
PCT Pub. Date: Aug. 31, 2023

(65) Prior Publication Data

US 2024/0292532 A1 Aug. 29, 2024

(30) Foreign Application Priority Data

Feb. 25, 2022 (JP) ................................ 2022-027579

(51) Int. Cl.
*H05K 1/05* (2006.01)
*H05K 1/02* (2006.01)
*H05K 3/12* (2006.01)

(52) U.S. Cl.
CPC ........... *H05K 1/056* (2013.01); *H05K 1/0298* (2013.01); *H05K 3/1208* (2013.01)

(58) Field of Classification Search
CPC ..... H05K 1/056; H05K 1/0298; H05K 3/1208
See application file for complete search history.

(56) References Cited

U.S. PATENT DOCUMENTS

2013/0036802 A1 2/2013 Johnson et al.
2019/0060137 A1 2/2019 Severns et al.

FOREIGN PATENT DOCUMENTS

JP 2014-529732 A 11/2014
JP 2017-150889 A 8/2017

(Continued)

OTHER PUBLICATIONS

International Search Report issued in PCT/JP2022/037293; mailed Nov. 8, 2022.

*Primary Examiner* — Jeremy C Norris
(74) *Attorney, Agent, or Firm* — Studebaker Brackett PLLC

(57) ABSTRACT

Provided is a component mount board having such a structure that a state of a component mount board being soaked in liquid can be more reliably sensed. A component mount board 100 includes a sheet-shaped moisture detection sensor 90. The moisture detection sensor 90 includes: a board 10 having a base 11, a first conductive pattern 30 formed on the base 11, and a mount component 50 electrically connected to the first conductive pattern 30; and a second conductive pattern 40 forming a circuit 60 together with the first conductive pattern 30 in a complementary manner. A portion of the base 11 corresponding to the second conductive pattern 40 is a missing portion 12. The component mount board 100 further includes a water-absorption expansion material 70. When expanding by water absorption, the water-absorption expansion material 70 presses the base 11 or the second conductive pattern 40 in a direction perpendicular to the plane of the base 11 to break the second conductive pattern 40.

8 Claims, 11 Drawing Sheets

(56) References Cited

FOREIGN PATENT DOCUMENTS

| | | | |
|---|---|---|---|
| JP | 2019-015589 | A | 1/2019 |
| JP | 2021-067660 | A | 4/2021 |
| JP | 2021-197465 | A | 12/2021 |

COMPONENT MOUNTING BOARD

TECHNICAL FIELD

The present invention relates to a component mount board.

BACKGROUND ART

Patent Document 1 describes a component mount board (sensor of this document) including a first board and a tuned radio frequency circuit supported on the first board. The tuned radio frequency circuit has a first conductive pattern, a first capacitor, and a jumper all arranged on the same side of the first board. The first capacitor includes a first capacitor plate, a second capacitor plate, and a first dielectric material arranged between the first capacitor plate and the second capacitor plate. The first dielectric material is soluble in liquid.

CITATION LIST

Patent Literature

Patent Literature 1: JP-T-2014-529732

SUMMARY OF INVENTION

Problems to be Solved by Invention

According to study conducted by the inventors of the present application, there is still room for improvement in the component mount board of Patent Document 1 in terms of reliability in sensing a state of the component mount board being soaked in liquid.

The present invention has been made in view of the above-described problems. The present invention provides a component mount board having a structure capable of more reliably sensing a state of the component mount board being soaked in liquid.

Solution to Problems

According to the present invention, a component mount board including a sheet-shaped moisture detection sensor is provided. The moisture detection sensor includes: a board having a base, a first conductive pattern formed on the base, and a mount component electrically connected to the first conductive pattern; and a second conductive pattern forming a circuit together with the first conductive pattern in a complementary manner. A portion of the base corresponding to the second conductive pattern is a missing portion. The component mount board further includes a water-absorption expansion material. When expanding by water absorption, the water-absorption expansion material presses the base or the second conductive pattern in a direction perpendicular to a plane of the base to break the second conductive pattern.

Effects of Invention

According to the present invention, the state of the component mount board being soaked in liquid can be more reliably sensed.

BRIEF DESCRIPTION OF DRAWINGS

FIG. 4 is a plan view of the component mount board according to the first embodiment;

DESCRIPTION OF EMBODIMENTS

First Embodiment

Figure 1:
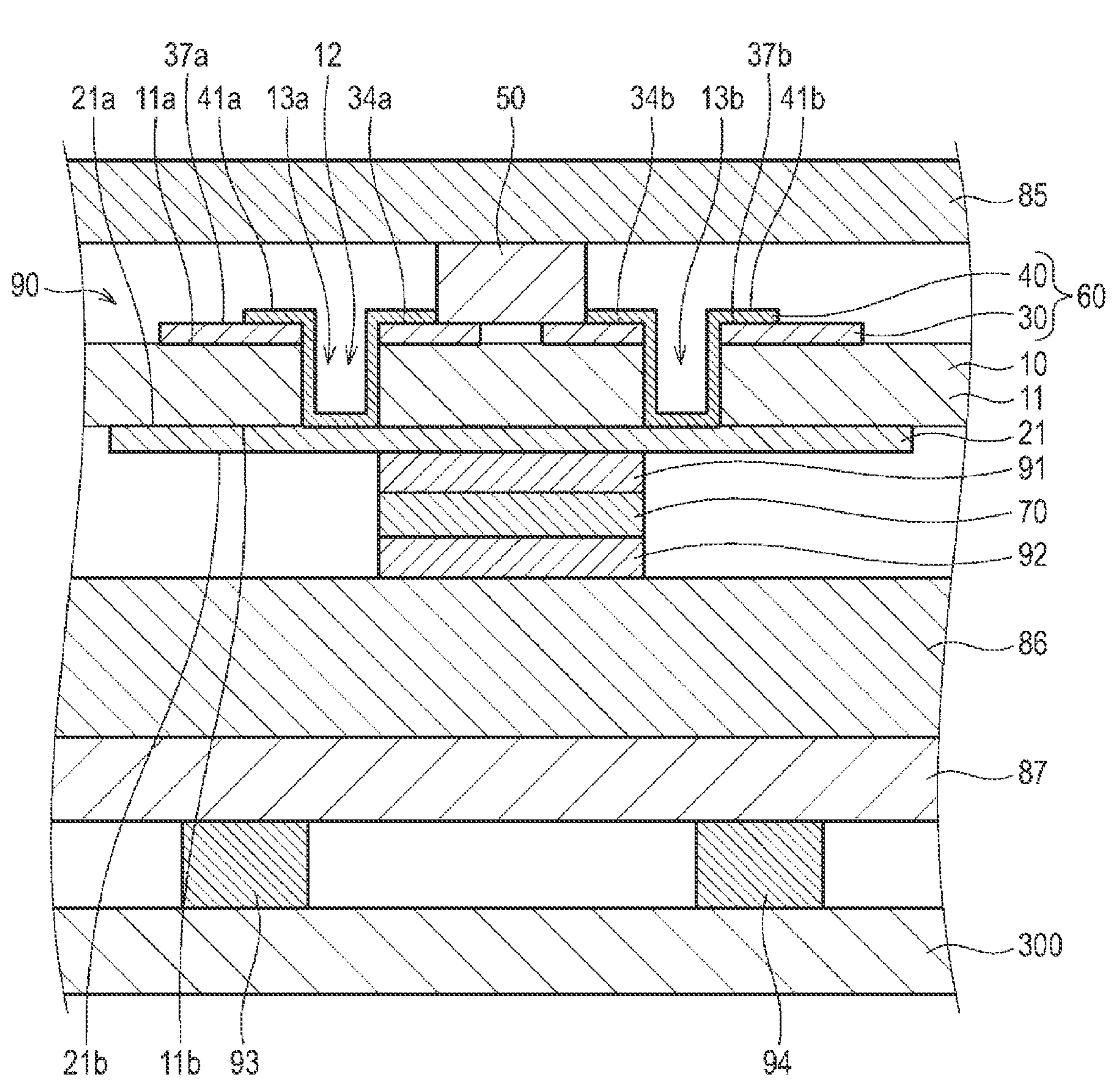
FIG. 1 is an end view of a component mount board according to a first embodiment, FIG. 1 showing a moisture detection sensor and a peripheral structure thereof.
Figure 2:
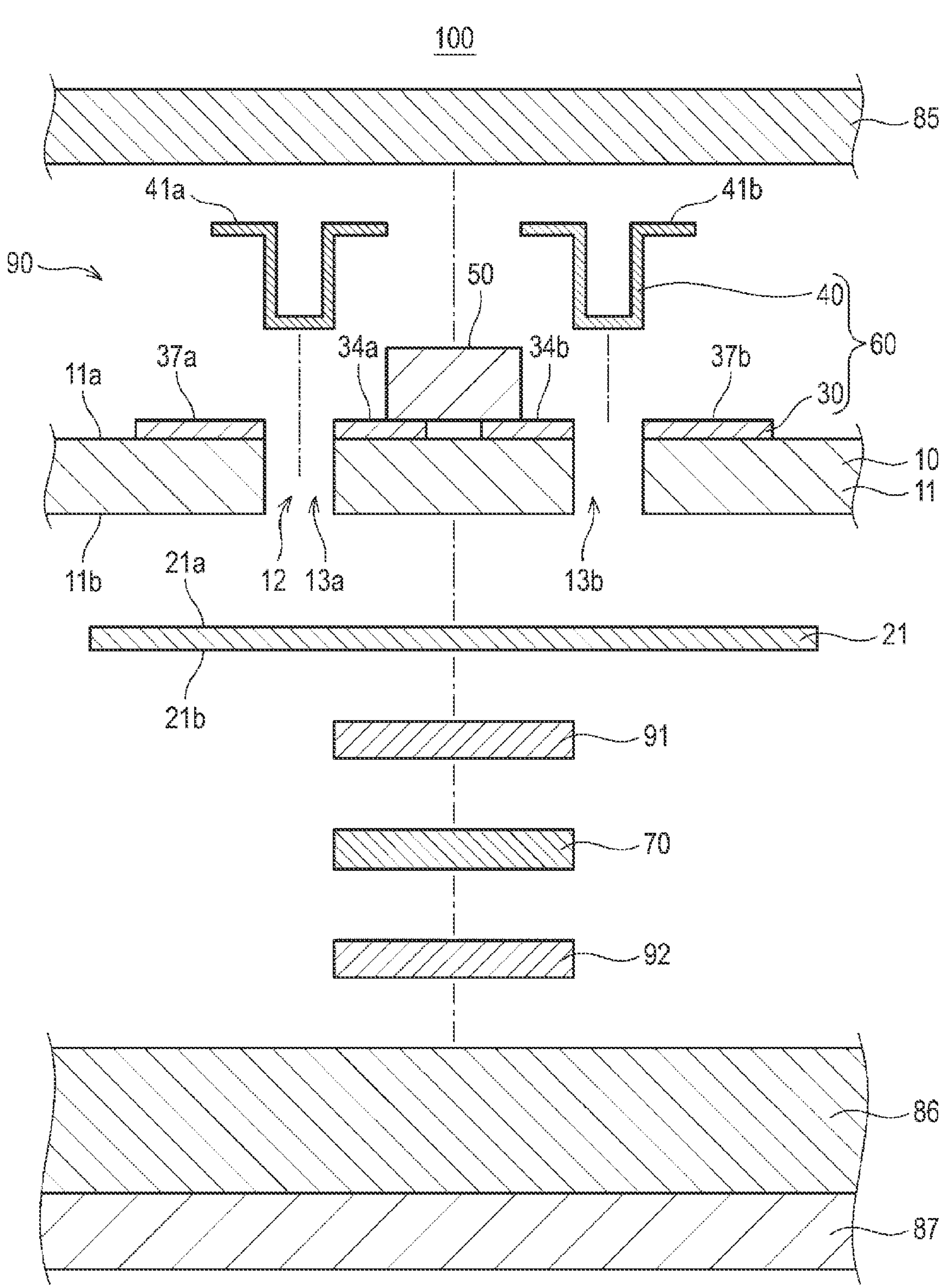
FIG. 2 is an exploded end view of the component mount board according to the first embodiment, FIG. 2 showing the moisture detection sensor and the peripheral structure thereof.
Figure 3:
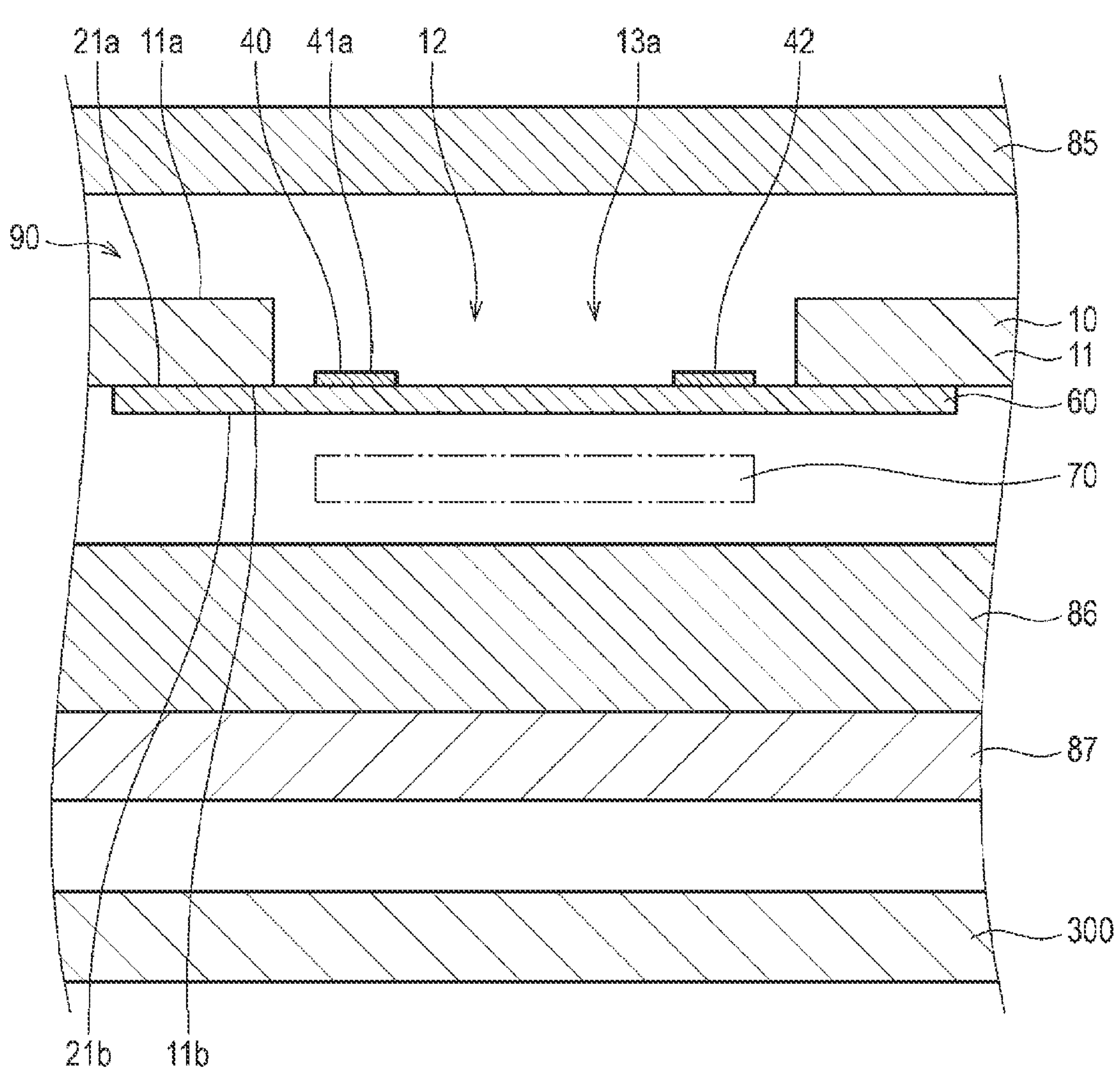
FIG. 3 is an end view of the component mount board according to the first embodiment, FIG. 3 showing the moisture detection sensor and the peripheral structure thereof.
Figure 4:
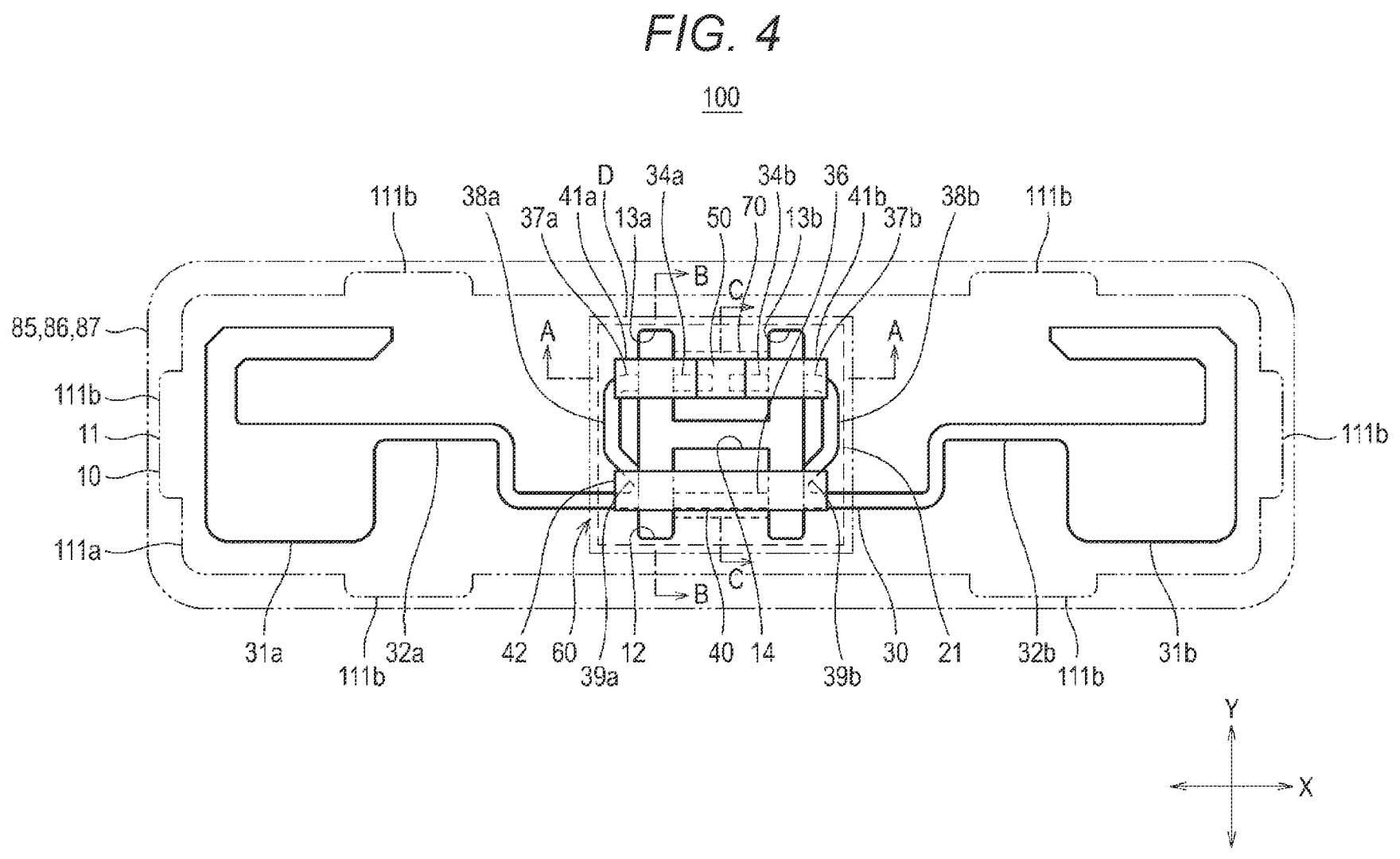

Hereinafter, a first embodiment of the present invention will be described using FIGS. 1 to 10. Note that in all the drawings, the same reference numerals are used to represent similar components and description thereof will be omitted as necessary. FIG. 1 shows a cut end surface along an A-A line shown in FIG. 4, and FIG. 2 is an exploded end view of a portion corresponding to that shown in FIG. 1. Moreover, FIG. 3 shows a cut end surface along a B-B line shown in FIG. 4.

As shown in FIGS. 1 and 2, a component mount board 100 according to the present embodiment includes a sheet-shaped moisture detection sensor 90. The moisture detection sensor 90 includes: a board 10 having a base 11, a first conductive pattern 30 formed on the base 11, and a mount component 50 electrically connected to the first conductive pattern 30; and a second conductive pattern 40 forming a circuit 60 together with the first conductive pattern 30 in a complementary manner. As shown in FIG. 4, a portion of the base 11 corresponding to the second conductive pattern 40 is a missing portion 12. The component mount board 100 further includes a water-absorption expansion material 70. When expanding by water absorption, the water-absorption expansion material 70 presses the base 11 or the second conductive pattern 40 in a direction perpendicular to the plane of the base 11, thereby breaking the second conductive pattern 40. Here, the portion of the base 11 corresponding to the second conductive pattern 40 is a portion corresponding to (overlapping with) the second conductive pattern 40 in plan view, i.e., as viewed in a direction perpendicular to the plane of the component mount board 100.

According to the present embodiment, the component mount board 100 includes the water-absorption expansion material 70 expandable by water absorption. The expanded water-absorption expansion material 70 presses the base 11 or the second conductive pattern 40 in the direction perpendicular to the plane of the base 11. Accordingly, external force is applied to the second conductive pattern 40, and therefore, the second conductive pattern 40 is broken. A state of the component mount board 100 being soaked in liquid can be sensed in such a manner that occurrence of breakage of the second conductive pattern 40 is indirectly detected by detection of a change in properties of the circuit 60 (mainly loss of the function of the circuit 60). Further, the portion of the base 11 corresponding to the second conductive pattern 40 is the missing portion 12. That is, it is configured such that part of the second conductive pattern 40 is not protected by the base 11. Thus, the second conductive pattern 40 can be more reliably broken by the water-absorption expansion material 70. In addition, liquid can be sufficiently supplied to the water-absorption expansion material 70 via the missing portion 12, and therefore, the water-absorption expansion material 70 can sufficiently expand by water absorption. As described above, according to the present embodiment, the state of the component mount board 100 being soaked in liquid can be more reliably sensed.

The component mount board 100 is, for example, a laminate formed in a sheet shape. The planar shape of the component mount board 100 may be, but not specifically limited to, a substantially rectangular shape (e.g., a rectangular shape with round corners) as shown in FIG. 4, as one example. In the case of the present embodiment, the mount component 50 is, as one example, an RFID chip (generally also called an IC chip), and the component mount board 100 is an RFID tag.

Hereinafter, in description of, e.g., a positional relationship among the components of the component mount board 100, the upper side in FIG. 1 will be referred to as an upper side or above, and the opposite side thereof will be referred to as a lower side or below, for example. Moreover, a direction perpendicular to the up-down direction will be described as a horizontal direction, for example. However, these directions are defined for the sake of convenience, and are not intended to limit directions upon manufacturing or use of the component mount board 100. The right-left direction in FIGS. 1 to 2 will be referred to as an X-direction, and the right-left direction in FIG. 3 will be referred to as a Y-direction. The X-direction and the Y-direction are directions (horizontal directions) parallel with the planar direction of the component mount board 100, and are perpendicular to the up-down direction (direction perpendicular to the plane of the component mount board 100) in FIG. 1.

As shown in FIGS. 1 to 3, the moisture detection sensor 90 further includes a soluble layer 21. The soluble layer 21 is arranged so as to face the base 11, and is soluble in liquid or is weakened when becoming wet with liquid. The soluble layer 21 holds part of the second conductive pattern 40, for example. According to this configuration, the soluble layer 21 holding the second conductive pattern 40 is dissolved by sufficient contact with liquid. Thus, the second conductive pattern 40 can be easily broken in such a manner that the expanded water-absorption expansion material 70 presses the base 11 or the second conductive pattern 40 in the direction perpendicular to the plane of the base 11. That is, the state of the component mount board 100 being soaked in liquid can be more reliably sensed.

As shown in FIGS. 1 and 2, in the moisture detection sensor 90, the first conductive pattern 30 is directly stacked on one surface 11*a* of the base 11. The second conductive pattern 40 is directly stacked on the first conductive pattern 30. Moreover, the base 11 is directly stacked on the soluble layer 21.

Figure 6:
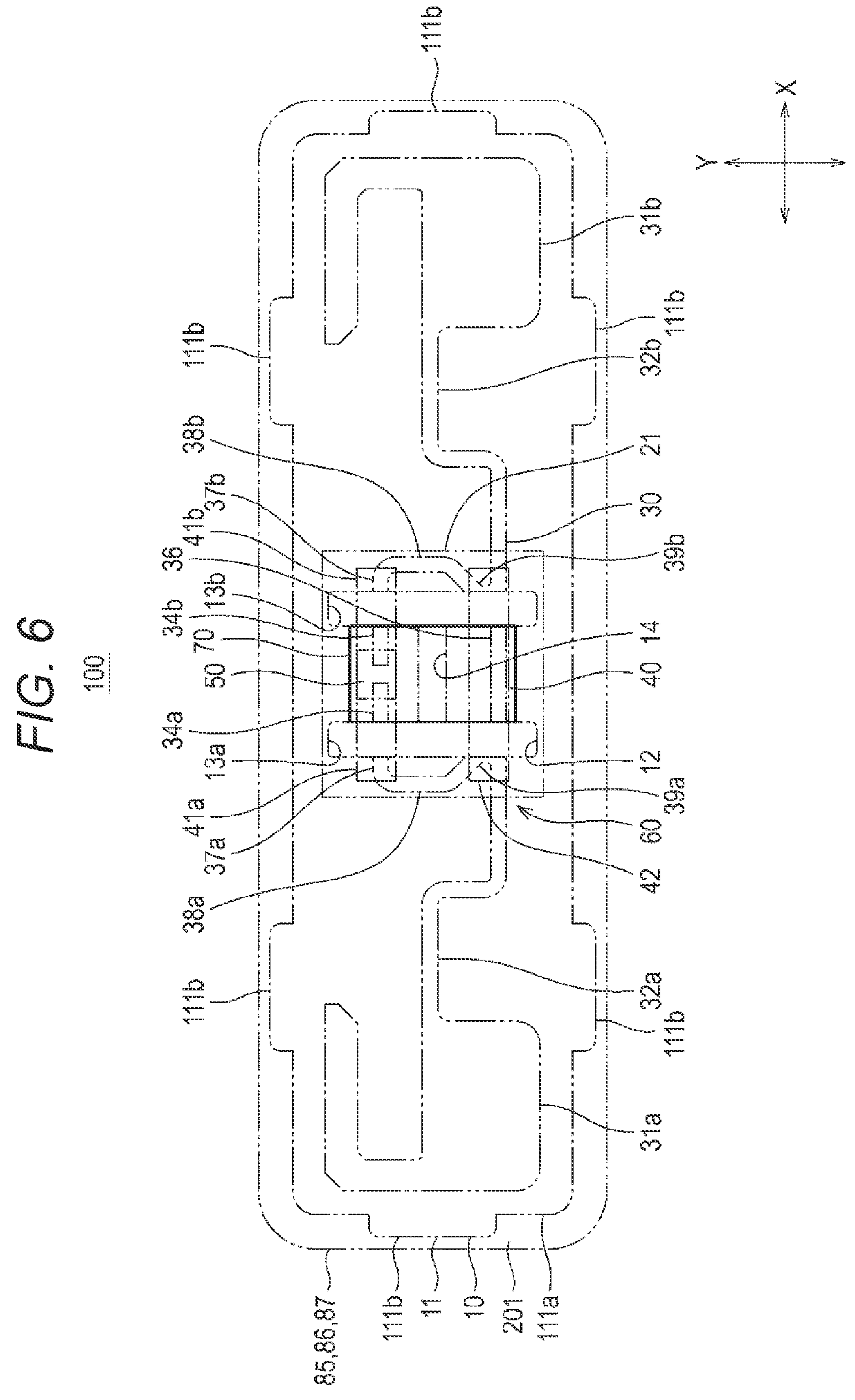
FIG. 6 is a plan view of the component mount board according to the first embodiment, FIG. 6 selectively showing a water-absorption expansion material by a solid line.

As shown in FIGS. 4 and 6, in the case of the present embodiment, the missing portion 12 is formed in a substantially H-shape in plan view. More specifically, the missing portion 12 includes, for example, a first extending portion 13*a* and a second extending portion 13*b* extending in parallel with each other along the planar direction of the base 11 and a third extending portion 14. The third extending portion 14 extends from an intermediate portion of the first extending portion 13*a* in the direction of extension thereof to an intermediate portion of the second extending portion 13*b* in the direction of extension thereof. The first extending portion 13*a* and the second extending portion 13*b* have the same shape, and are arranged symmetrically in the right-left direction. More specifically, each of the first extending portion 13*a* and the second extending portion 13*b* is formed, for example, in a substantially rectangular shape (e.g., a rectangular shape with round corners) elongated in the Y-direction. The third extending portion 14 extends in the X-direction, for example. One end portion of the third extending portion 14 in the longitudinal direction thereof is connected to the intermediate portion of the first extending portion 13*a* in the direction of extension thereof. The other end portion is connected to the intermediate portion of the second extending portion 13*b* in the direction of extension thereof. Note that the shape of the missing portion 12 is not limited to the above-described example. The missing portion 12 is an opening formed in the base 11. That is, the missing portion 12 penetrates the base 11 from the front to the back thereof. In a region where the missing portion 12 is present, no first conductive pattern 30 is formed. The missing portion 12 may be in a slit shape.

In the case of the present embodiment, the first conductive pattern 30 has, as one example, an antenna wiring portion and a component mount wiring portion described below.

The antenna wiring portion includes a first antenna wiring portion located on the left side in FIG. 4 and a second antenna wiring portion located on the right side. The first antenna wiring portion has, for example, a wide portion 31*a* and a narrow portion 32*a* formed narrower than the wide portion 31*a* and extending in the X-direction. In plan view, the wide portion 31*a* includes, for example, a first portion having a substantially rectangular shape in plan view and a second portion. The second portion extends from an upper end of a left edge portion of the first portion to one side (above in FIG. 4) in the Y-direction, and further extends to one side (right in FIG. 4) in the X-direction. The narrow portion 32*a* is formed, for example, in such a shape that an intermediate portion of the narrow portion 32*a* in the longitudinal direction thereof is bent in the Y-direction in plan view. More specifically, each of right and left end portions of the narrow portion 32*a* in the longitudinal direction thereof extends in the X-direction. Also, the intermediate portion of the narrow portion 32*a* in the longitudinal direction thereof extends in the Y-direction from a right end of the left end portion to a left end of the right end portion. The left end of the narrow portion 32*a* is connected to the wide portion 31*a*, and the right end of the narrow portion 32*a* is connected to the component mount wiring portion. The second antenna wiring portion is formed, for example, symmetrical to the first antenna wiring portion in the right-left direction, and has a wide portion 31*b* and a narrow portion 32*b*. A right end of the narrow portion 32*b* is connected to the wide portion 31*b*, and a left end of the narrow portion 32*b* is connected to the component mount wiring portion.

The component mount wiring portion has annular pattern forming portions 34*a*, 37*a*, 38*a*, 39*a*, 34*b*, 37*b*, 38*b*, 39*b* and a coupling portion 36. The annular pattern forming portion 39*a* is connected to the right end of the narrow portion 32*a*. The annular pattern forming portion 39*a* is inclined upward from the right end of the narrow portion 32*a* to one side (above in FIG. 4) in the Y-direction. The annular pattern forming portion 38*a* extends from one end of the annular pattern forming portion 39*a* to one side (above in FIG. 4) in the Y-direction (i.e., extends in the Y-direction). The annular pattern forming portion 37*a* extends rightward from one end of the annular pattern forming portion 38*a* (i.e., extends in the X-direction). The annular pattern forming portion 34*a* is arranged on the extension of the annular pattern forming portion 37*a* with the left first extending portion 13*a* interposed therebetween, and extends in the X-direction. The annular pattern forming portion 39*b* is connected to the left end of the narrow portion 32*b*. The annular pattern forming portion 39*b* is inclined upward from the left end of the narrow portion 32*b* to one side (above in FIG. 4) in the Y-direction. The annular pattern forming portion 38*b* extends from one end of the annular pattern forming portion 39*b* to one side (above in FIG. 4) in the Y-direction (i.e., extends in the Y-direction). The annular pattern forming portion 37*b* extends leftward from one end of the annular pattern forming portion 38*b* (i.e., extends in the X-direction). The annular pattern forming portion 34*b* is arranged on the extension of the annular pattern forming portion 37*b* with the right second extending portion 13*b* interposed therebetween, and extends in the X-direction. The annular pattern forming portion 34*a* is arranged on the extension of the annular pattern forming portion 34*b*, and vice versa. The coupling portion 36 extends in the X-direction. More specifically, a left end of the coupling portion 36 is arranged on the extension of the boundary between the annular pattern forming portion 39*a* and the narrow portion 32*a* with the left first extending portion 13*a* interposed therebetween. A right end of the coupling portion 36 is arranged on the extension of the boundary between the annular pattern forming portion 39*b* and the narrow portion 32*b* with the right second extending portion 13*b* interposed therebetween.

The soluble layer 21 contains polyvinyl alcohol (PVA), for example. Since the soluble layer 21 contains PVA, a structure of the soluble layer 21 being favorably dissolved when the component mount board 100 contacts moisture can be achieved. Note that in a case where the soluble layer 21 is soluble in water, the material of the soluble layer 21 is not limited to PVA and may be polyvinylpyrrolidone, water-soluble polyester, a water-soluble paper material, or a sheet material derived from a starch component. Further, in the case of the present embodiment, the soluble layer 21 contains resin having hot melt properties, and is hot-melt joined to the base 11. That is, the soluble layer 21 is fusion-joined to the base 11. Note that the present invention is not limited to this example and the soluble layer 21 may be joined to the base 11 with a water-soluble adhesive (not shown).

Figure 5:
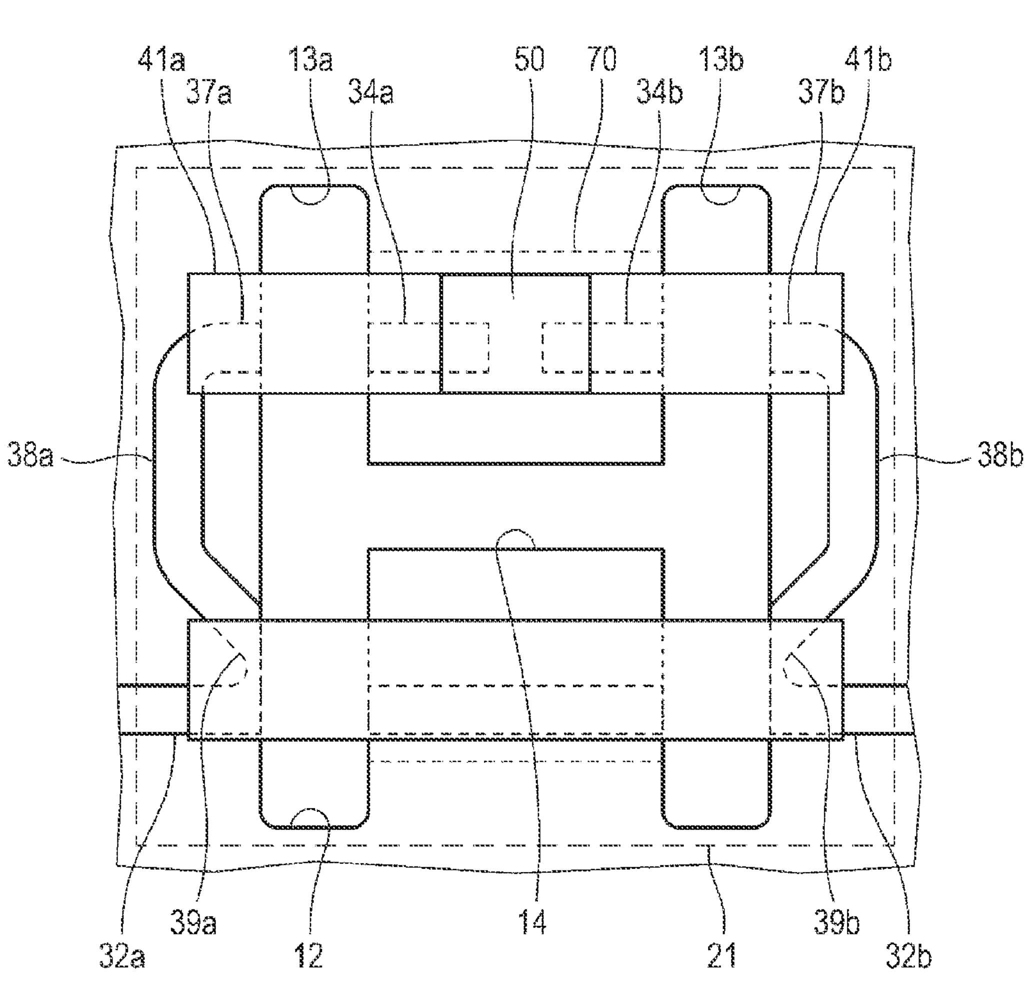
FIG. 5 is a partially-enlarged view of a portion D shown in FIG. 4.

As shown in FIG. 5, the component mount board 100 has, as the second conductive pattern 40, bridge portions 41*a*, 41*b*, 42 extending in the X-direction, for example. That is, the component mount board 100 has, for example, multiple second conductive patterns 40. As shown in FIG. 4, the bridge portion 41*a* connects a right end portion of the annular pattern forming portion 37*a* and a left end portion of the annular pattern forming portion 34*a* to each other. The bridge portion 41*b* connects a left end portion of the annular pattern forming portion 37*b* and a right end portion of the annular pattern forming portion 34*b* to each other. Accordingly, the annular pattern forming portion 37*a*, the bridge portion 41*a*, the annular pattern forming portion 34*a*, the annular pattern forming portion 34*b*, the bridge portion 41*b*, and the annular pattern forming portion 37*b* connect the first antenna wiring portion and the second antenna wiring portion to each other. The bridge portion 42 connects the boundary between the annular pattern forming portion 39*a* and the narrow portion 32*a*, and the boundary between the annular pattern forming portion 39*b* and the narrow portion 32*b* to each other, and extends along the coupling portion 36. Accordingly, the annular pattern forming portion 38*a*, the annular pattern forming portion 37*a*, the bridge portion 41*a*, the annular pattern forming portion 34*a*, the annular pattern forming portion 34*b*, the bridge portion 41*b*, the annular pattern forming portion 37*b*, the annular pattern forming portion 38*b*, the annular pattern forming portion 39*b*, the bridge portion 42, and the annular pattern forming portion 39*a* form an annular pattern. The annular pattern is formed in a substantially annular shape in plan view, for example. The annular pattern is non-continuous between the annular pattern forming portion 34*a* and the annular pattern forming portion 34*b*. That is, the annular pattern is in a shape (opened annular shape) having an opening. As shown in, e.g., FIGS. 1 and 5, the mount component 50 is arranged over a portion between the annular pattern forming portion 34*a* and the annular pattern forming portion 34*b*.

The bridge portion 41*a* is arranged over the left first extending portion 13*a*. The bridge portion 41*b* is arranged over the right second extending portion 13*b*. As shown in FIG. 5, the bridge portion 41*a* is bridged between the annular pattern forming portion 38*a* and the annular pattern forming portion 34*a* to electrically connect the annular pattern forming portion 38*a* and the annular pattern forming portion 34*a* to each other. Similarly, the bridge portion 41*b* is bridged between the annular pattern forming portion 38*b* and the annular pattern forming portion 34*b* to electrically connect the annular pattern forming portion 38*b* and the annular pattern forming portion 34*b* to each other. The bridge portion 42 is bridged between the left first extending portion 13*a* and the right second extending portion 13*b*. More specifically, a left end portion of the bridge portion 42 is arranged over the left first extending portion 13*a*. A right end portion of the bridge portion 42 is arranged over the right second extending portion 13*b*. The left end portion of the bridge portion 42 electrically connects the boundary between the annular pattern forming portion 39*a* and the narrow portion 32*a* and the left end of the coupling portion 36 to each other. The right end portion of the bridge portion 42 electrically connects the boundary between the annular pattern forming portion 39*b* and the narrow portion 32*b* and a right end of the coupling portion 36 to each other.

As described above, the second conductive pattern 40 (each of the bridge portions 41*a*, 41*b*, 42) is arranged over the missing portion 12, and is bridged between the first and second portions of the first conductive pattern 30 to electrically connect the first and second portions to each other. The second portion is a portion of the first conductive pattern 30 apart from the first portion with the missing portion 12 interposed therebetween. That is, each second conductive pattern 40 is a bridge wiring. The second conductive patterns 40 extend, in side view, over part of a peripheral edge portion of the missing portion 12, part of an inner peripheral surface of the missing portion 12, a portion of one surface 21*a* of the soluble layer 21 corresponding to the missing portion 12, and other portions of the peripheral edge portion of the missing portion 12.

The component mount board 100 may have, as the second conductive pattern 40, a portion other than the above-described bridge portions 41*a* to 42. Note that the bridge portions 41*a* to 42 are wiring portions forming the circuit 60. That is, a portion (bridge portions 41*a* to 42) of the second conductive pattern 40 corresponding to the missing portion 12 is not an electrode etc., but is a wiring portion forming the circuit 60.

The second conductive pattern 40 (each of the bridge portions 41*a*, 41*b*, 42) is preferably formed thicker than a portion (annular pattern forming portions 34*a*, 34*b*, 37*a*, 37*b*, 39*a*, 39*b*) of the first conductive pattern 30 connected to the second conductive pattern 40. With this configuration, when the board 10 and the soluble layer 21 are aligned and assembled with each other and the second conductive pattern 40 and the first conductive pattern 30 are electrically connected to each other, even if the board 10 and the soluble layer 21 are slightly misaligned in the planar direction, the second conductive pattern 40 can be connected to the first conductive pattern 30 in such a manner to be in proper alignment with the first conductive pattern 30. Note that in a case where the first conductive pattern 30 is, for example, a pattern derived from metal foil and the impedance thereof is low, if the second conductive pattern 40 is a coating film formed by printing, the impedance of the second conductive pattern 40 is expected to be a higher value than the impedance of the above-described pattern made of metal foil. On this point, the second conductive pattern 40 is formed thicker than the portion of the first conductive pattern 30 connected to the second conductive pattern 40 as described above, and it is advantageous because impedance matching between the first conductive pattern 30 and the second conductive pattern 40 can be made in a low impedance state. Note that the second conductive pattern 40 may be formed with the same width as that of the portion of the first conductive pattern 30 connected to the second conductive pattern 40 or be formed thinner than such a portion.

The length of the second conductive pattern 40 is preferably longer than the width dimension of the portion (annular pattern forming portions 34*a*, 34*b*, 37*a*, 37*b*, 39*a*, 39*b*, narrow portions 32*a*, 32*b*, coupling portion 36) of the first conductive pattern 30 connected to the second conductive pattern 40, and is preferably a length twice as long as the width dimension or more and more preferably three times as long as the width dimension or more. Specifically, the length (bridge length) of a portion of the second conductive pattern 40 bridged over the first conductive pattern 30 (between the first portion and the second portion) is preferably longer than the width dimension of the portion of the first conductive pattern 30 connected to the second conductive pattern 40, and is preferably a length twice as long as the width dimension or more and more preferably three times as long as the width dimension or more.

In the case of the present embodiment, the second conductive pattern 40 is not soluble in liquid. The second conductive pattern 40 is, for example, a coating film formed by printing or metal foil. More specifically, the second conductive pattern 40 is, for example, a silver pattern. The thickness dimension of the second conductive pattern 40 is, but not specifically limited to, preferably 10 μm or more and 50 μm or less, for example. Since the thickness dimension of the second conductive pattern 40 is 10 μm or more, stable properties of the circuit 60 can be obtained at a stage before contact of the component mount board 100 with liquid. Since the thickness dimension of the second conductive pattern 40 is 50 μm or less, the second conductive pattern 40 can be easily broken when the component mount board 100 contacts liquid.

Note that the present invention is not limited to the above-described example. For example, the second conductive pattern 40 may be soluble in liquid. In this case, it can be expected that initial properties of the circuit 60 cannot be maintained by dissolving or weakening and breakage of the second conductive pattern 40 due to sufficient contact of the second conductive pattern 40 with liquid. Accordingly, the state of the component mount board 100 being soaked in liquid can be detected.

In the case of the present embodiment, the second conductive patterns 40 as the bridge wirings are arranged at multiple locations on the circuit 60. Thus, a probability of any of the second conductive patterns 40 being broken upon contact of the component mount board 100 with liquid can be enhanced.

In the case of the present embodiment, the base 11 is not soluble in liquid. Thus, even when the component mount board 100 accidentally contacts liquid upon, e.g., storage, a probability of the properties of the circuit 60 being changed due to breakage or cracking of the first conductive pattern 30 by dissolving of the base 11 can be reduced. The base 11 insoluble in liquid may be made of paper or a resin film, for example. Examples of a resin material forming the resin film may include, but not specifically limited to, polyethylene terephthalate, polyethylene, polystyrene, polypropylene, and polyester. Note that the present invention is not limited to this example and the base 11 may be soluble in liquid. The thickness dimension of the base 11 is, but not specifically limited to, preferably 10 μm or more and 100 μm or less. Since the thickness dimension of the base 11 is 10 μm or more, the base 11 can stably support the first conductive pattern 30 and the structural strength of the component mount board 100 can be sufficiently obtained. Since the thickness dimension of the base 11 is 100 μm or less, favorable flexibility of the component mount board 100 is obtained.

In the case of the present embodiment, the first conductive pattern 30 is also not soluble in liquid. Thus, a probability of the properties of the circuit 60 being changed due to dissolving of the first conductive pattern 30 even when the component mount board 100 accidentally contacts liquid upon, e.g., storage can be reduced. Specifically, over the half of the circuit 60 is preferably formed by the first conductive pattern 30 insoluble in liquid. Note that the present invention is not limited to this example and the first conductive pattern 30 may be soluble in liquid. The first conductive pattern 30 is, for example, a coating film formed by printing or metal foil. The first conductive pattern 30 is, for example, a coating film containing a conductive filler and a binder containing thermoplastic resin. Examples of the conductive filler may include gold, silver, copper, and carbon. Examples of the thermoplastic resin may include polyester resin, acrylic resin, and urethane resin. The first conductive pattern 30 which is the metal foil may be formed by punching or etching, for example. The thickness dimension of the first conductive pattern 30 is, but not specifically limited to, 5 μm or more and 30 μm or less, for example.

Note that the outer shape of the board 10 (base 11) and the outer shape of the soluble layer 21 may be the same as each other or be different from each other. For example, in the case of the present embodiment, in plan view, the board 10 (base 11) is formed in a substantially rectangular shape elongated in the X-direction, and the soluble layer 21 is formed in a substantially rectangular shape having an outer dimension smaller than that of the board 10 (base 11). More specifically, in plan view, the soluble layer 21 is arranged at a portion of the board 10 (base 11) corresponding to the missing portion 12, and the entirety of the missing portion 12 is within the outline of the soluble layer 21. Further, in plan view, the entirety of the second conductive patterns 40 and the component mount wiring portion (annular pattern forming portions 34*a*, 37*a*, 38*a*, 39*a*, 34*b*, 37*b*, 38*b*, 39*b* and coupling portion 36) are within the outline of the soluble layer 21.

Although not shown in detail, the mount component 50 includes, for example, a component body having an element formed by resin molding and a mount terminal provided along a lower surface of the component body. The element and the mount terminal are electrically connected to each other in the resin-molded body. The number of mount terminals included in the mount component 50 is not specifically limited. In the case of the present embodiment, the mount component 50 includes two mount terminals, and each mount terminal is electrically connected to the first conductive pattern 30. More specifically, one mount terminal of the mount component 50 is electrically connected to a right end portion of the annular pattern forming portion 34*a*. The other mount terminal of the mount component 50 is electrically connected to a left end portion of the annular pattern forming portion 34*b*. That is, the mount component 50 is arranged over the annular pattern forming portion 34*a* and the annular pattern forming portion 34*b*. As described above, the mount component 50 is mounted on the component mount wiring portion.

The antenna wiring portion exchanges a signal with not-shown external equipment (e.g., an RFID reader/writer), for example. A signal or radio wave received from the external equipment by the antenna wiring portion is input to the mount component 50. The mount component 50 transmits a signal to the external equipment via the component mount wiring portion and the antenna wiring portion. Note that in some cases, part or the entirety of the component mount wiring portion may function as an antenna in cooperation with the antenna wiring portion. The mount component 50 is, for example, of a passive type to be operated with power excited from the external equipment via the antenna wiring portion.

In the case of the present embodiment, the communication function of the component mount board 100 is eliminated or degraded by breakage (details will be described later) of the second conductive pattern 40 due to contact of the component mount board 100 with liquid. Elimination or degradation of the communication function is detected by the external equipment so that contact of the component mount board 100 with liquid can be detected.

In the case of the present embodiment, as shown in FIGS. 1 to 3, the water-absorption expansion material 70 is arranged on the other surface 21*b* side of the soluble layer 21. Note that in FIG. 3, the water-absorption expansion material 70 is indicated by a chain double-dashed line. The water-absorption expansion material 70 is formed, for example, in a sheet shape, and is arranged along the other surface 21*b* of the soluble layer 21. In plan view, the water-absorption expansion material 70 is formed in a substantially rectangular shape elongated in the Y-direction, for example. In plan view, the entirety of the water-absorption expansion material 70 is arranged inside the outline of the soluble layer 21. The water-absorption expansion material 70 is arranged, for example, at a location corresponding to a portion between the first extending portion 13*a* and the second extending portion 13*b* on the base 11. In the case of the present embodiment, the "portion between the first extending portion 13*a* and the second extending portion 13*b* on the base 11" is, for example, a portion between a right edge of the first extending portion 13*a* and a left edge of the second extending portion 13*b* on the base 11. More specifically, as shown in FIG. 5, a left edge of the water-absorption expansion material 70 is substantially coincident with the right edge of the left first extending portion 13*a*, and a right edge of the water-absorption expansion material 70 is substantially coincident with the left edge of the right second extending portion 13*b*, as one example. Moreover, in plan view, the entirety of the third extending portion 14 is arranged inside the outline of the water-absorption expansion material 70. More specifically, as shown in FIG. 6, in plan view, the annular pattern forming portion 34*a*, a portion of the bridge portion 41*a* corresponding to the annular pattern forming portion 34*a*, the annular pattern forming portion 34*b*, and a portion of the bridge portion 41*b* corresponding to the annular pattern forming portion 34*b* are arranged inside the outline of the water-absorption expansion material 70. Similarly, in plan view, the coupling portion 36 and a portion of the bridge portion 42 corresponding to the coupling portion 36 are arranged inside the outline of the water-absorption expansion material 70. According to this configuration, as described later, the water-absorption expansion material 70 expanded by water absorption can easily break the bridge portions 41*a*, 41*b*, 42 connecting the first antenna wiring portion and the second antenna wiring portion to each other. Thus, contact of the component mount board 100 with liquid can be more reliably detected. Note that in the present invention, the component mount board 100 may only be required to be configured such that the water-absorption expansion material 70 expanded by water absorption breaks at least one of the bridge portion 41*a* or the bridge portion 41*b*. That is, in the present invention, the water-absorption expansion material 70 may only be required to be arranged, in plan view, in a region including the bridge portion 41*a* or the bridge portion 41*b*. For example, an outer edge of the water-absorption expansion material 70 may be located, in plan view, in a region overlapping with the missing portion 12 beyond the portion between the first extending portion 13*a* and the second extending portion 13*b* on the base 11.

The water-absorption expansion material 70 is, as one example, a compressed cellulose sponge. Note that the present invention is not limited to this example. The water-absorption expansion material 70 may be, for example, a member expandable by water absorption other than the compressed cellulose sponge, such as a water absorbing polymer.

Further, as shown in FIGS. 1 and 2, the component mount board 100 includes, for example, a water-conducting sheet 86. The water-conducting sheet 86 is arranged on the opposite side of the water-absorption expansion material 70 from the moisture detection sensor 90. With this configuration, the water-conducting sheet 86 can absorb liquid (e.g., water), and therefore, liquid can be sufficiently supplied to the water-absorption expansion material 70. The water-conducting sheet 86 is preferably arranged at least in a region including the water-absorption expansion material 70 in plan view. The water-conducting sheet 86 may be arranged over the entire surface of the component mount board 100, or may be arranged selectively in a partial region of the component mount board 100. In the present embodiment, the water-conducting sheet 86 is arranged, as one example, in a region including the entirety of the first conductive pattern 30 in plan view.

The component mount board 100 includes, for example, a first restraining sheet (later-described first water permeable sheet 85 in the case of the present embodiment) and a second restraining sheet (later-described second water permeable sheet 87 in the case of the present embodiment). The first restraining sheet is arranged on one surface (one surface 11*a* in the case of the present embodiment) side of the moisture detection sensor 90, and the second restraining sheet is arranged on the other surface (other surface 21*b* in the case of the present embodiment) side. The first restraining sheet and the second restraining sheet restrain the periphery of a region, where the second conductive pattern 40 is arranged, in the moisture detection sensor 90. In the case of the present embodiment, as one example, the first restraining sheet and the second restraining sheet restrain at least the periphery of a region, where the first conductive pattern 30 is arranged, in the moisture detection sensor 90. Note that the periphery of the region where the second conductive pattern 40 is arranged is the periphery of a region including the entirety of the missing portion 12.

Figure 7:
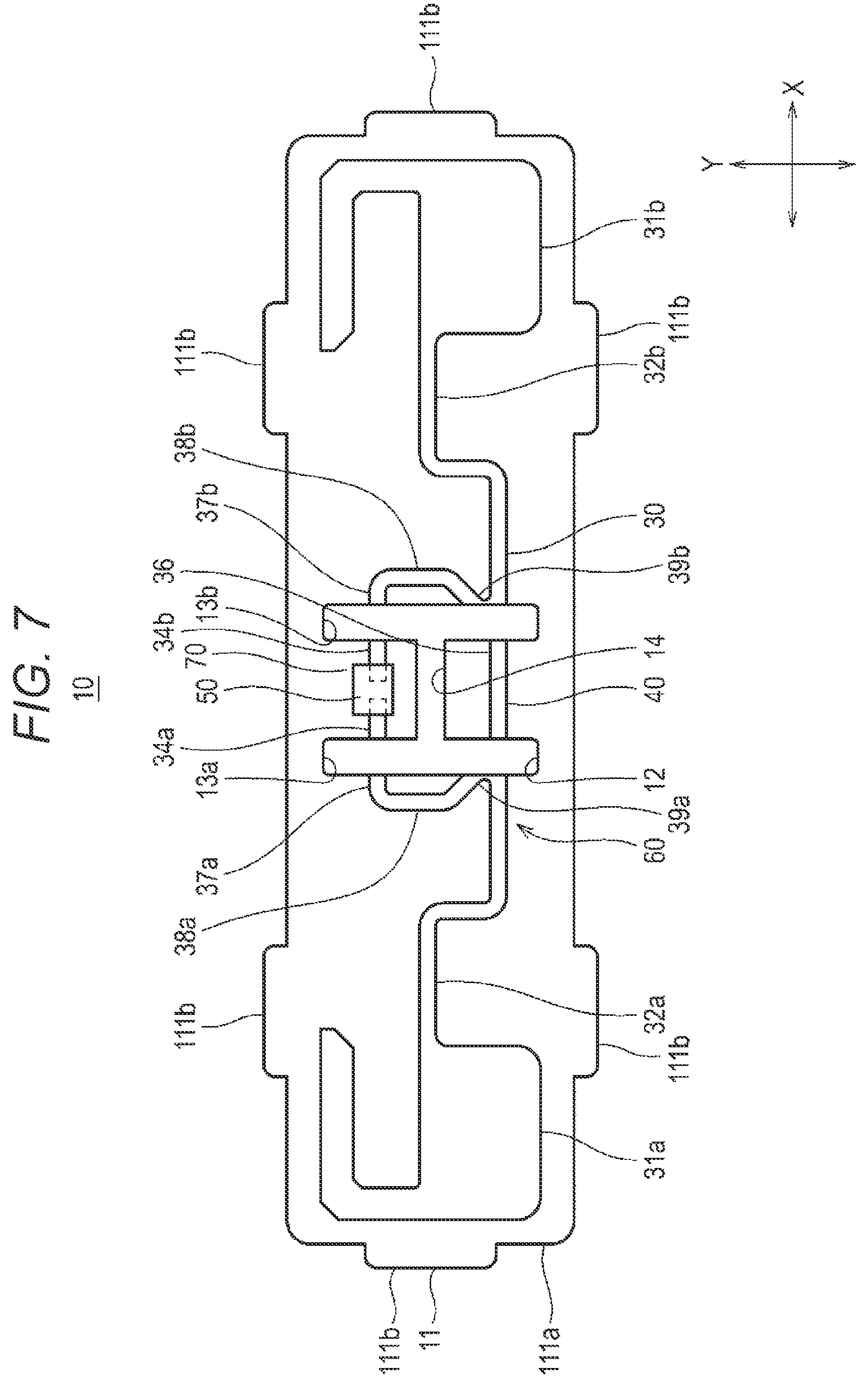
FIG. 7 is a plan view of a board 10 in the first embodiment.

More specifically, in the case of the present embodiment, the base 11 includes, as shown in FIG. 7, a body portion 111*a* having a substantially rectangular shape elongated in the X-direction in plan view and multiple fixing pieces 111*b*, for example. The multiple fixing pieces 111*b* protrude outward of a peripheral edge of the body portion 111*a*, and are arranged apart from each other. Part of the first restraining sheet is directly or indirectly fixed to one-side surfaces of the multiple fixing pieces 111*b*. Part of the second restraining sheet is directly or indirectly joined to the other-side surfaces of the multiple fixing pieces 111*b*. At a portion between the multiple fixing pieces 111*b* in the planar direction of the base 11, the first restraining sheet and the second restraining sheet are directly or indirectly bonded to each other without the fixing pieces 111*b*. With this configuration, a peripheral edge portion of the moisture detection sensor 90 is restrained by the first restraining sheet and the second restraining sheet. The multiple fixing pieces 111*b* include those arranged with the body portion 111*a* interposed therebetween in the X-direction and those arranged with the body portion 111*a* interposed therebetween in the Y-direction. Thus, the first restraining sheet and the second restraining sheet can restrain the base 11 at both end portions of the base 11 in the X-direction and both end portions of the base 11 in the Y-direction.

In the case of the present embodiment, the component mount board 100 includes, for example, the first water permeable sheet 85 as the first restraining sheet and the second water permeable sheet 87 as the second restraining sheet. Note that in FIG. 4, each of the first water permeable sheet 85 and the second water permeable sheet 87 is indicated by a chain double-dashed line. With this configuration, the first water permeable sheet 85 or the second water permeable sheet 87 can quickly supply liquid to the water-absorption expansion material 70. More specifically, the first water permeable sheet 85 or the second water permeable sheet 87 can quickly supply liquid to the water-absorption expansion material 70 both in a case where the surface of the component mount board 100 on the side on which the first water permeable sheet 85 is arranged is mainly soaked in liquid and a case where the surface of the component mount board 100 on the side on which the second water permeable sheet 87 is arranged is mainly soaked in liquid.

More specifically, in the case of the present embodiment, the moisture detection sensor 90, the water-absorption expansion material 70, and the water-conducting sheet 86 are arranged in this order from above between the first water permeable sheet 85 and the second water permeable sheet 87, as shown in FIG. 1. Further, a double-sided tape 91 is arranged between the other surface (other surface 21*b* of the soluble layer 21) of the moisture detection sensor 90 and one surface (upper surface) of the water-absorption expansion material 70. Similarly, a double-sided tape 92 is arranged between the other surface (lower surface) of the water-absorption expansion material 70 and one surface (upper surface) of the water-conducting sheet 86. In this manner, the water-absorption expansion material 70 is fixed between the other surface (other surface 21*b*) of the moisture detection sensor 90 and one surface (upper surface) of the water-conducting sheet 86.

In the case of the present embodiment, the outer shape of the first water permeable sheet 85 and the outer shape of the second water permeable sheet 87 are the same as each other and are coincident with each other in plan view, for example. Moreover, part of a peripheral edge portion of the first water permeable sheet 85 and part of a peripheral edge portion of the second water permeable sheet 87 are joined (e.g., thermocompressed) to each other. More specifically, at the peripheral edge portion of the first water permeable sheet 85 and the peripheral edge portion of the second water permeable sheet 87, the first water permeable sheet 85 and the second water permeable sheet 87 are directly joined to each other without the fixing pieces 111*b* between the multiple fixing pieces 111*b* in the planar direction of the base 11. Moreover, portions of the peripheral edge portion of the first water permeable sheet 85 corresponding to the multiple fixing pieces 111*b* are joined to the one-side surfaces of the fixing pieces 111*b*. Portions of the peripheral edge portion of the second water permeable sheet 87 corresponding to the multiple fixing pieces 111*b* are joined to the other-side surfaces of the fixing pieces 111*b*. With this configuration, the peripheral edge portion of the moisture detection sensor 90 is restrained by the first water permeable sheet 85 and the second water permeable sheet 87.

The water-conducting sheet 86 is, but not specifically limited to, high water-absorption (water-holding) rayon non-woven fabric as one example, and the weight thereof is, for example, 40 g/m2 or more and 80 g/m2 or less and preferably 50 g/m2 or more and 70 g/m2 or less. Note that the water-conducting sheet 86 may be, for example, pulp, cotton, or hemp. Each of the first water permeable sheet 85 and the second water permeable sheet 87 is, but not specifically limited to, non-woven fabric made of polyester, polypropylene, or polyethylene terephthalate and having a weight of 5 g/m2 or more and 100 g/m2 or less and preferably 10 g/m2 or more and 50 g/m2 or less, as one example. With this configuration, the water permeability of each of the first water permeable sheet 85 and the second water permeable sheet 87 can be favorably ensured.

Figure 8:
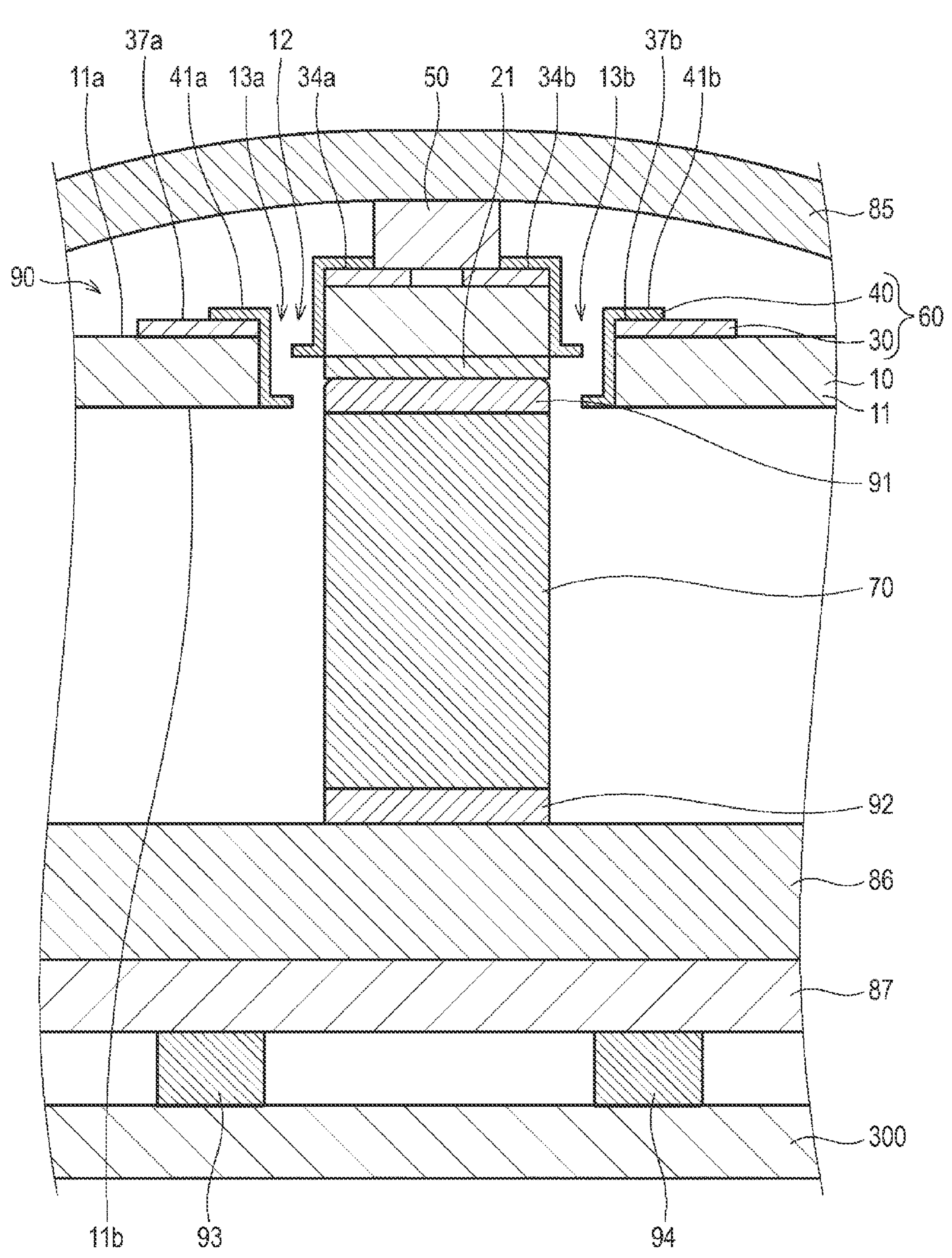
FIG. 8 is an end view along an A-A line shown in FIG. 4, FIG. 8 showing a state in which the water-absorption expansion material has expanded.
Figure 9:
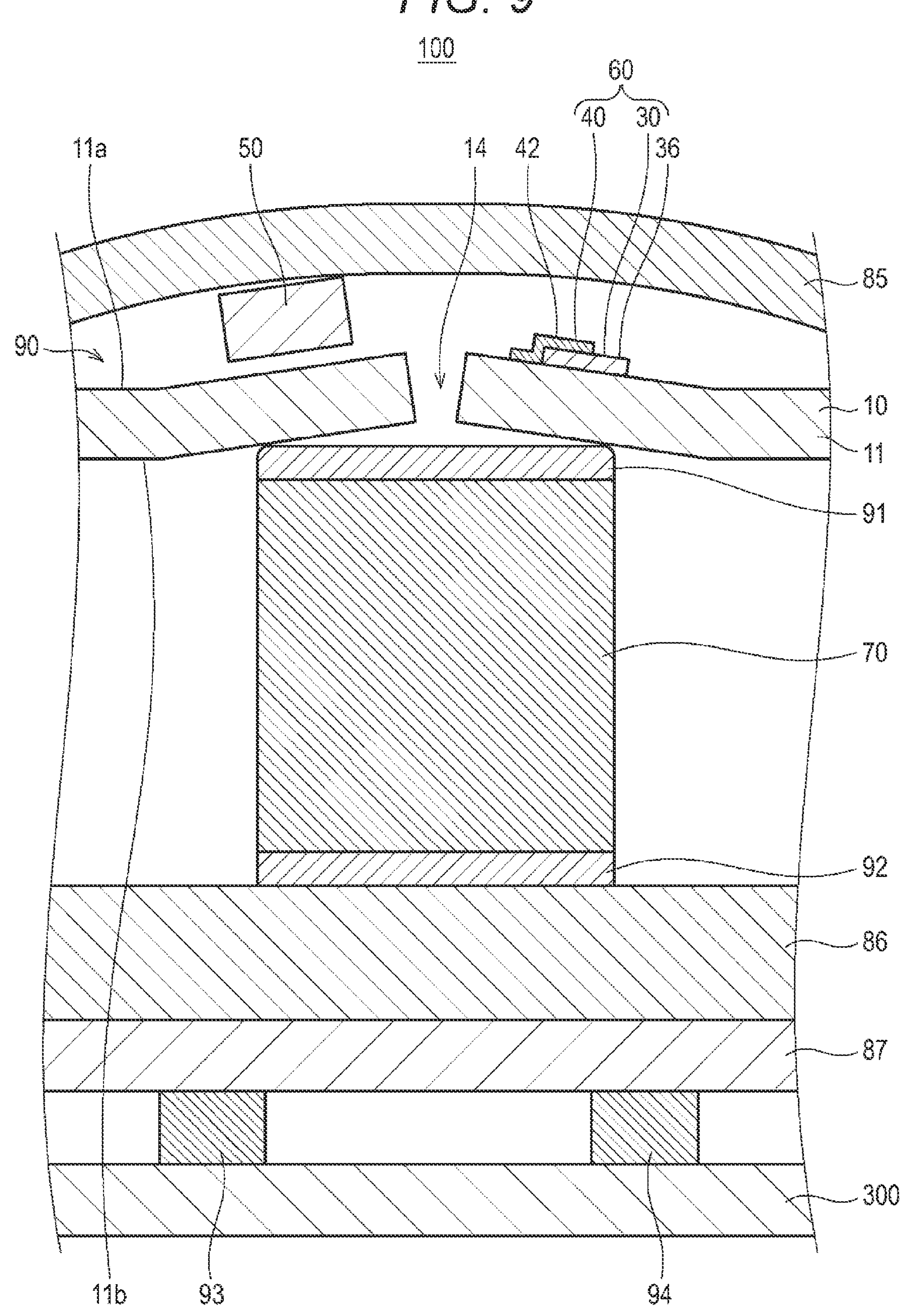
FIG. 9 is an end view along a C-C line shown in FIG. 4, FIG. 9 showing a state in which the water-absorption expansion material has expanded.

Hereinafter, one example of operation when the water-absorption expansion material 70 expanded by water absorption presses the base 11 or the second conductive pattern 40 in the direction perpendicular to the plane of the base 11 and breaks the second conductive pattern 40 will be described. As shown in FIGS. 8 and 9, when the component mount board 100 is soaked in liquid, the water-absorption expansion material 70 absorbs the liquid and expands. Note that at this point, the soluble layer 21 may be fully dissolved or only part of the soluble layer 21 may be dissolved due to contact with the liquid. In the example shown in FIG. 8, a portion of the soluble layer 21 corresponding to the water-absorption expansion material 70 is not dissolved, but maintains its shape. In the example shown in FIG. 9, the soluble layer 21 is fully dissolved. The expanded water-absorption expansion material 70 presses, in the direction perpendicular to the plane of the base 11 (above in FIG. 8 in the case of the present embodiment), a portion of the base 11 between the first extending portion 13*a* and the second extending portion 13*b* and a portion of the second conductive pattern 40 between the first extending portion 13*a* and the second extending portion 13*b*. Accordingly, two portions of the base 11 sandwiching the missing portion 12 displace relative to each other. More specifically, the peripheral edge portion of the moisture detection sensor 90 is restrained by the first water permeable sheet 85 and the second water permeable sheet 87 as described above. Thus, a portion of the base 11 between the right edge of the first extending portion 13*a* and the left edge of the second extending portion 13*b* displaces upward with respect to a left portion of the base 11 with respect to a left edge of the first extending portion 13*a* and a right portion of the base 11 with respect to a right edge of the second extending portion 13*b*. Moreover, a right portion of the bridge portion 41*a* with respect to the right edge of the first extending portion 13*a* displaces upward with respect to a left portion of the bridge portion 41*a* with respect to the left edge of the first extending portion 13*a*. Similarly, a left portion of the bridge portion 41*b* with respect to the left edge of the second extending portion 13*b* displaces upward with respect to a right portion of the bridge portion 41*b* with respect to the right edge of the second extending portion 13*b*. A portion of the bridge portion 42 between the right edge of the first extending portion 13*a* and the left edge of the second extending portion 13*b* displaces upward with respect to a left portion of the bridge portion 42 with respect to the left edge of the first extending portion 13*a* and a right portion of the bridge portion 42 with respect to the right edge of the second extending portion 13*b*. Accordingly, the bridge portion 41*a* bridged over the right and left edges of the first extending portion 13*a*, the bridge portion 41*b* bridged over the right and left edges of the second extending portion 13*b*, and the bridge portion 42 bridged over the left edge of the first extending portion 13*a* and the right edge of the second extending portion 13*b* are broken.

As described above, in the case of the present embodiment, the missing portion 12 includes the third extending portion 14. The third extending portion 14 extends from the intermediate portion of the first extending portion 13*a* in the direction of extension thereof to the intermediate portion of the second extending portion 13*b* in the direction of extension thereof. In plan view, the substantially entirety of the third extending portion 14 is arranged inside the outline of the water-absorption expansion material 70. Thus, the expanded water-absorption expansion material 70 presses the third extending portion 14, and accordingly, the portion of the base 11 between the first extending portion 13*a* and the second extending portion 13*b* can be displaced upward with a smaller moment. That is, the two portions of the base 11 sandwiching the missing portion 12 can smoothly displace relative to each other. Further, as shown in FIG. 9, the third extending portion 14 and the periphery thereof in the base 11 can be displaced upward with respect to other portions by pressing of the water-absorption expansion material 70. Accordingly, the bridge portions 41*a*, 41*b* arranged with the third extending portion 14 interposed therebetween can be more reliably broken in the Y-direction.

Further, for example, the expansion of the water-absorption expansion material 70 in a first direction (thickness direction of the water-absorption expansion material 70 in the case of the present embodiment) is greater than the expansion in a second direction (width direction of the water-absorption expansion material 70 in the case of the present embodiment) perpendicular to the first direction. Also, the water-absorption expansion material 70 is arranged such that the first direction is coincident with the direction perpendicular to the plane of the base 11. With this configuration, the two portions of the base 11 sandwiching the missing portion 12 can be sufficiently relatively displaced in the direction (up-down direction) perpendicular to the plane of the base 11. Thus, the second conductive pattern 40 (bridge portions 41*a*, 41*b*, 42) can be more reliably broken.

As one example, the thickness dimension of the water-absorption expansion material 70 before expansion is, for example, preferably 0.2 mm or more and 3 mm or less and more preferably 0.5 mm or more and 2 mm or less. Moreover, as one example, the thickness dimension of the water-absorption expansion material 70 after expansion is preferably 1 mm or more and 20 mm or less and more preferably 5 mm or more and 15 mm or less.

As described above, the water-absorption expansion material 70 presses part of the base 11, thereby displacing the two portions of the base 11 sandwiching the missing portion 12 relative to each other. The missing portion 12 includes, for example, the first extending portion 13*a* and the second extending portion 13*b* extending in parallel with each other along the planar direction of the base 11. The water-absorption expansion material 70 is arranged at the portion of the base 11 between the first extending portion 13*a* and the second extending portion 13*b*, and presses such a portion of the base 11. Moreover, the water-absorption expansion material 70 is formed in the sheet shape, and the first direction is the thickness direction of the water-absorption expansion material 70.

Figure 10:
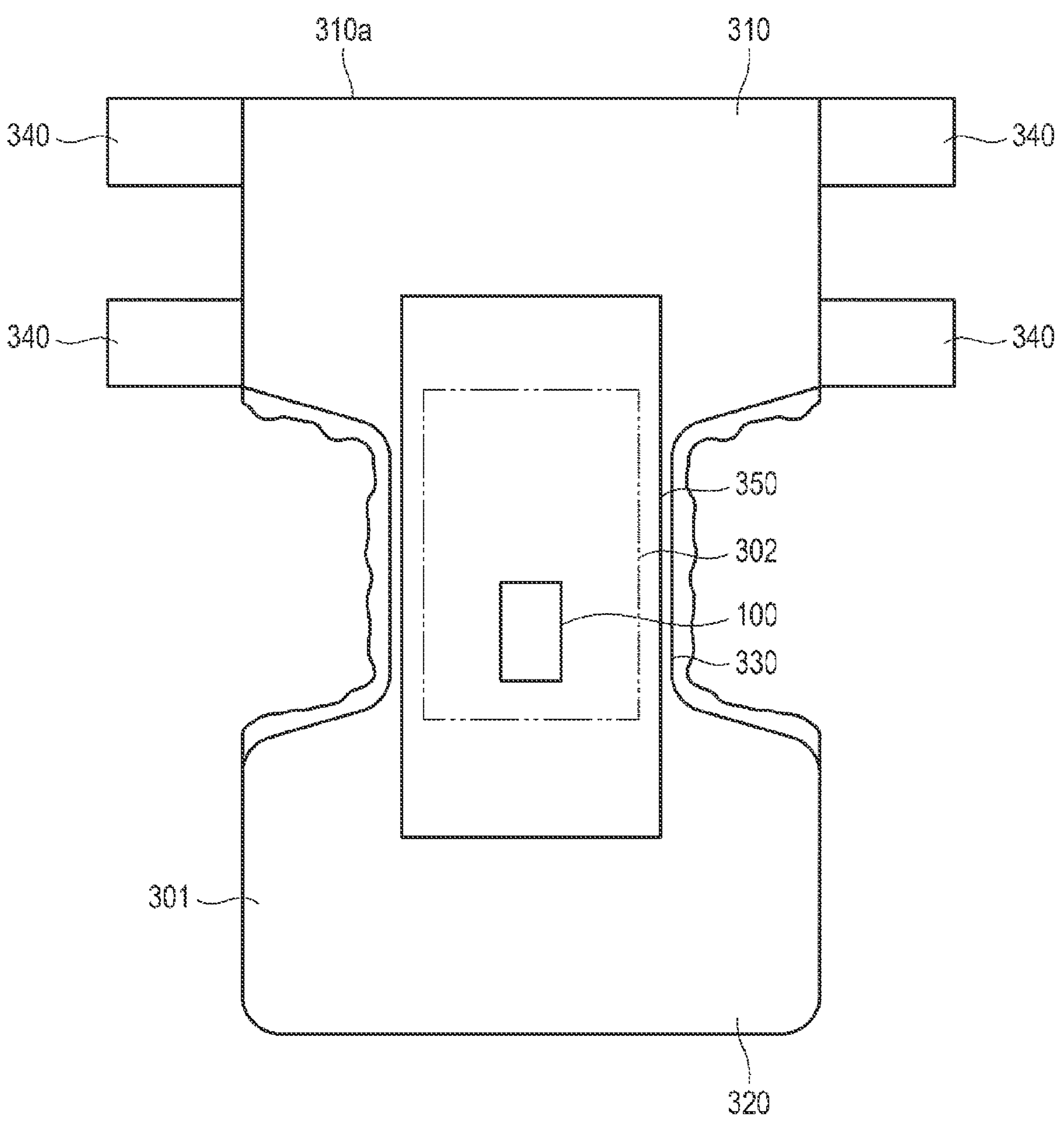
FIG. 10 is a schematic development view of a paper diaper including the component mount board according to the first embodiment.

The component mount board 100 according to the present embodiment is attached, as one example, to a water absorbing product (e.g., paper diaper 300 shown in FIG. 10) capable of absorbing liquid. Note that FIG. 10 shows the surface of the paper diaper 300 on the side of contact with the skin of a wearer. FIGS. 1, 3, 8, and 9 show, as one example, a state in which the component mount board 100 is attached to the paper diaper 300. When the wearer urinates in the paper diaper 300 and the water-absorption expansion material 70 expands due to the urine, such a state is sensed so that urination of the wearer can be sensed. That is, the component mount board 100 is utilized as a urination sensor that notifies a carer of the timing of replacement of the paper diaper 300.

A paper diaper body 301 includes, for example, a back portion 310 arranged on the back side of the user, a front portion 320 arranged on the belly side of the user, a coupling portion 330 coupling the back portion 310 and the front portion 320 to each other, and multiple hook-and-loop fastener portions 340 formed on side portions of the back portion 310, as shown in FIG. 10. Both side portions of the back portion 310 and both side portions of the front portion 320 are coupled to each other through the hook-and-loop fastener portions 340 so that the user can wear the paper diaper 300. An absorber 350 capable of absorbing liquid is formed on the surface of the paper diaper 300 on the side of contact with the skin of the user. The absorber 350 extends, for example, in the front-back direction over the back portion 310, the front portion 320, and the coupling portion 330. In a state in which the user wears the paper diaper 300, the absorber 350 is arranged at a location where the absorber 350 contacts the external urethral opening of the user. When the user urinates, the urine is absorbed by the absorber 350.

The component mount board 100 is preferably arranged, for example, on the surface of the paper diaper body 301 on the side of contact with the skin of the user. In the case of the present embodiment, the component mount board 100 is attached, as one example, to the paper diaper body 301 through, e.g., a double-sided tape 93, 94 or a hook-and-loop fastener (not shown). The component mount board 100 is attached to the paper diaper body 301 in such a posture that one surface (one surface 11*a*) side of the moisture detection sensor 90 is arranged on the side of contact with the skin of the user and the other surface (other surface 21*b*) side of the moisture detection sensor 90 is arranged on the side (i.e., paper diaper body 301 side) opposite to the side of contact with the skin of the user, for example. In the example shown in FIG. 1, the second water permeable sheet 87 is attached, through the double-sided tape 93, 94, to the surface of the paper diaper body 301 on the side of contact with the skin of the user.

The component mount board 100 is provided, for example, on the absorber 350 of the paper diaper body 301. As long as the component mount board 100 is within the area of a portion 302 of the absorber 350 corresponding to the external urethral opening, the component mount board 100 may be provided at a portion corresponding to the coupling portion 330 or be provided at a portion corresponding to the front portion 320. That is, the arrangement location of the component mount board 100 can be changed as necessary within the area of the portion 302 corresponding to the external urethral opening. Thus, regardless of the gender of the user, the component mount board 100 is applicable. In the example shown in FIG. 10, the component mount board 100 is arranged in such a posture that the longitudinal direction of the component mount board 100 is the front-back direction.

Note that in the present invention, the arrangement location of the component mount board 100 on the paper diaper 300 is not limited to the above-described example. For example, the component mount board 100 may be arranged along a peripheral edge (e.g., upper edge 310*a* of the back portion 310 or lower edge of the front portion 320) of a portion of the paper diaper body 301 other than the portion 302 corresponding to the external urethral opening. With this configuration, urine having leaked from the paper diaper body 301 can be more reliably detected by the component mount board 100. In the present invention, the shape, orientation, arrangement, posture, and the like of the component mount board 100 are not specifically limited, and can be set as necessary according to, e.g., the size and use application of the paper diaper body 301. In the present invention, the number of component mount boards 100 arranged on the paper diaper 300 is not specifically limited. The number of component mount boards 100 arranged on the paper diaper 300 may be two or more. In this case, the component mount boards 100 may be each arranged on the portion 302 corresponding to the external urethral opening and the peripheral edge of the portion other than the portion 302 corresponding to the external urethral opening, for example.

Next, a method for manufacturing the component mount board 100 in the present embodiment will be described. The method for manufacturing the component mount board 100 in the present embodiment includes a step of preparing the board 10, a step of assembling the board 10 and the soluble layer 21 to each other, a step of printing and forming the second conductive pattern 40 on the board 10 and the soluble layer 21, and a step of joining the first water permeable sheet 85 and the second water permeable sheet 87 to each other. In the step of preparing the board 10, the board 10 (see FIG. 7) having the base 11, the first conductive pattern 30 formed on the base 11, and the mount component 50 electrically connected to the first conductive pattern 30 is prepared. In the step of assembling the board 10 and the soluble layer 21 to each other, the board 10 and the soluble layer 21 are assembled to each other such that the soluble layer 21 is arranged in the region including the missing portion 12 in plan view. That is, the board 10 and the soluble layer 21 are faced and aligned with each other, and are bonded to each other. In the step of printing and forming the second conductive pattern 40 on the board 10 and the soluble layer 21, the first conductive pattern 30 and the second conductive pattern 40 form the circuit 60 in a complementary manner, and the second conductive pattern 40 is arranged over the corresponding missing portion 12. In this manner, the moisture detection sensor 90 is obtained. In the step of joining the first water permeable sheet 85 and the second water permeable sheet 87 to each other, the first water permeable sheet 85, the moisture detection sensor 90, the first double-sided tape 91, the water-absorption expansion material 70, the second double-sided tape 92, the water-conducting sheet 86, and the second water permeable sheet 87 are stacked in this order from above. Part of the peripheral edge portion of the first water permeable sheet 85 and part of the peripheral edge portion of the second water permeable sheet 87 are joined to each other. In this manner, the component mount board 100 in the present embodiment is obtained.

The board 10 and the soluble layer 21 can be bonded in such a manner that the board 10 and the soluble layer 21 are thermocompressed (thermally laminated) to each other. As one example, the step of thermocompressing the board 10 and the soluble layer 21 to each other is performed preferably at 80° C. or more and 150° C. or less and more preferably 100° C. or more and 120° C. or less. A heating time may be, for example, about 5 to 10 seconds. Moreover, the thermocompressing step is preferably performed under a pressurization condition of 0.3 MPa or more and 3.0 MPa or less and more preferably a pressurization condition of 1.0 MPa or more and 2.0 MPa or less. The board 10 and the soluble layer 21 are bonded as described above so that the second conductive pattern 40 can be favorably electrically connected to the first conductive pattern 30.

Similarly, the first water permeable sheet 85 and the second water permeable sheet 87 can be bonded in such a manner that the first water permeable sheet 85 and the second water permeable sheet 87 are thermocompressed (thermally laminated) to each other.

A method for forming the missing portion 12 in the board 10 is not specifically limited. As one example, a technique of forming the missing portion 12 by punching and mainly applying a blade or a punch is a representative method. Note that the present invention is not limited to this example. For example, laser processing may be applied.

Second Embodiment

Figure 11:
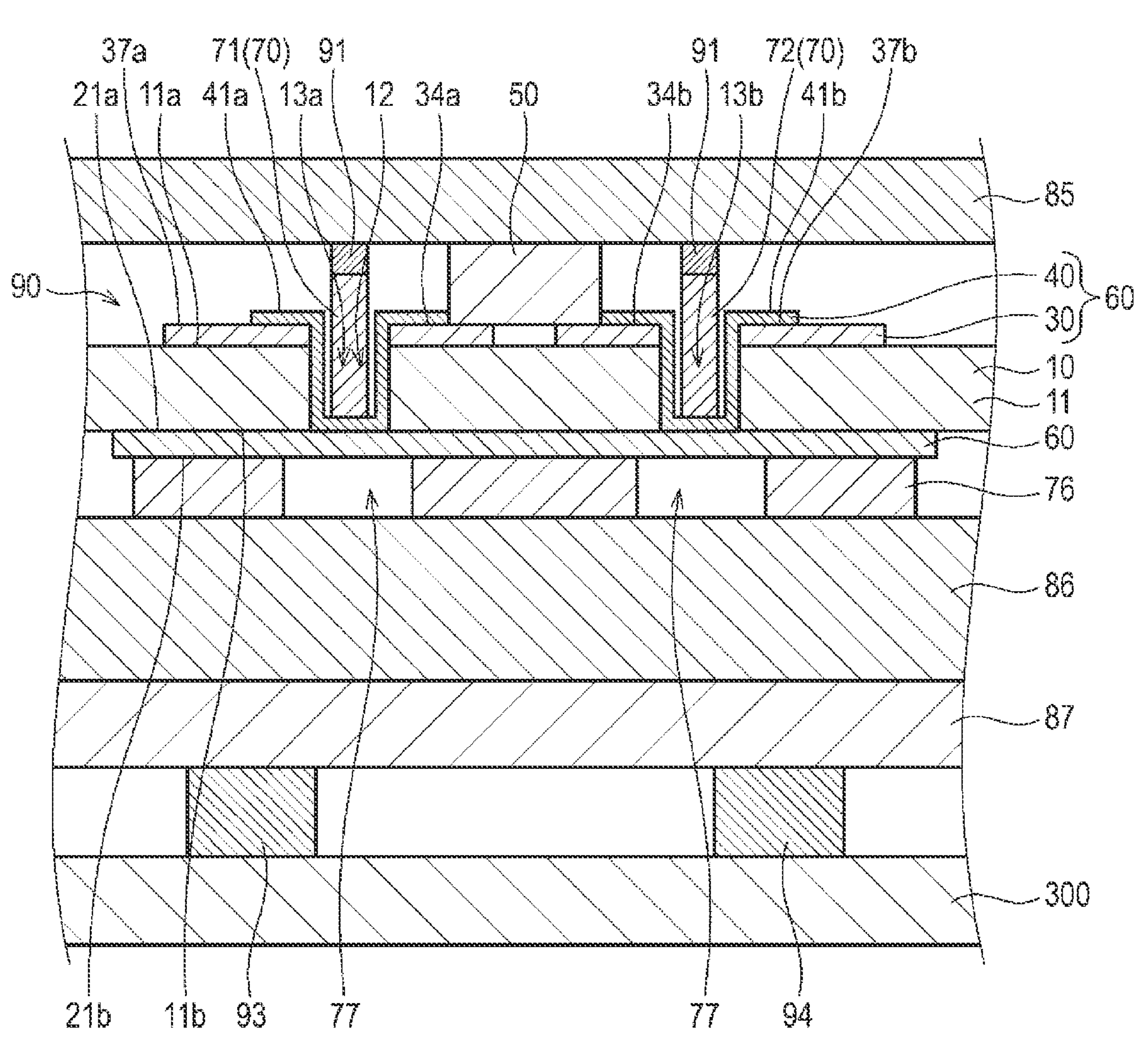
FIG. 11 is an end view of a component mount board according to a second embodiment, FIG. 11 showing a moisture detection sensor and a peripheral structure thereof.

Next, a second embodiment will be described using FIG. 11. Note that FIG. 11 shows a cut end surface of a portion corresponding to FIG. 1. A component mount board 100 according to the present embodiment is different from the component mount board 100 according to the first embodiment described above on the following points, and is configured similarly to the component mount board 100 according to the first embodiment described above on the other points.

In the case of the present embodiment, a water-absorption expansion material 70 is arranged at a location corresponding to a second conductive pattern 40, and in a missing portion 12, presses the second conductive pattern 40. Also with this configuration, the expanded water-absorption expansion material 70 can break the second conductive pattern 40, and a state of the component mount board 100 being soaked in liquid can be more reliably sensed.

As shown in FIG. 11, the component mount board 100 includes multiple water-absorption expansion materials 70. The multiple water-absorption expansion materials 70 are arranged on the opposite side of a base 11 from a soluble layer 21 side. More specifically, as shown in FIG. 11, the component mount board 100 includes a pair of right and left water-absorption expansion materials 71, 72. The left water-absorption expansion material 71 is arranged inside a first extending portion 13*a*. The right water-absorption expansion material 72 is arranged inside a second extending portion 13*b*. Moreover, the left water-absorption expansion material 71 is directly stacked on a portion of a bridge portion 41*a* corresponding to the first extending portion 13*a*. The right water-absorption expansion material 72 is directly stacked on a portion of a bridge portion 41*b* corresponding to the second extending portion 13*b*. For example, double-sided tapes 91 are each provided at end portions of the pair of right and left water-absorption expansion materials 71, 72 on a first water permeable sheet 85 side. With the double-sided tapes 91, the pair of right and left water-absorption expansion materials 71, 72 is fixed to the first water permeable sheet 85. When the component mount board 100 is soaked in liquid, the expanded water-absorption expansion materials 71, 72 directly press the corresponding bridge portions 41*a*, 41*b* in a direction (below in FIG. 11 in the case of the present embodiment) perpendicular to the plane of the base 11, thereby breaking the bridge portions 41*a*, 41*b*. That is, also with this configuration, the state of the component mount board 100 being soaked in liquid can be more reliably sensed.

As shown in FIG. 11, in the case of the present embodiment, the component mount board 100 further includes a spacer 76 arranged along the other surface 21*b* of the soluble layer 21. Portions of the spacer 76 corresponding to the first extending portion 13*a* and the second extending portion 13*b* are second missing portions 77. With this configuration, a space where each of the pair of right and left water-absorption expansion materials 71, 72 expands in the direction (thickness direction of the water-absorption expansion materials 71, 72) perpendicular to the plane of the base 11 can be sufficiently ensured. Thus, the expanded water-absorption expansion materials 71, 72 can more reliably break the second conductive pattern 40.

Note that in the case of the present embodiment, an insoluble sheet material (not shown) may be arranged instead of the soluble layer 21, for example. In this case, the sheet material is preferably configured such that the water-absorption expansion materials 71, 72 also break the sheet material when the expanded water-absorption expansion materials 71, 72 break the second conductive pattern 40.

The embodiments have been described above with reference to the drawings. These embodiments are examples of the present invention. Various configurations other than those described above can also be employed.

For example, in the examples described above, the mount component 50 is the RFID chip. However, the present invention is not limited to these examples. The mount component 50 may be other electronic components such as a capacitor or a resistor.

In the examples described above, the second conductive pattern 40 is bridged between the first portion of the first conductive pattern 30 and the second portion which is the portion of the first conductive pattern 30 apart from the first portion with the missing portion 12 interposed therebetween. However, the present invention is not limited to these examples. The second conductive pattern 40 is not necessarily bridged over the first conductive pattern 30, and may be merely connected to the first conductive pattern 30. As one simple example, the left half of the circuit 60 shown in FIG. 1 is formed by the first conductive pattern 30, and the right half is formed by the second conductive pattern 40.

In the examples described above, the board 10 has one missing portion 12. However, the number of missing portions 12 included in the board 10 is not specifically limited, and for example, may be two or more.

The present embodiments include the following technical ideas.

(1) A component mount board including: a sheet-shaped moisture detection sensor, in which the moisture detection sensor includes: a board having a base, a first conductive pattern formed on the base, and a mount component electrically connected to the first conductive pattern; and a second conductive pattern forming a circuit together with the first conductive pattern in a complementary manner, a portion of the base corresponding to the second conductive pattern is a missing portion, the component mount board further includes a water-absorption expansion material, and when expanding by water absorption, the water-absorption expansion material presses the base or the second conductive pattern in a direction perpendicular to a plane of the base to break the second conductive pattern.

(2) The component mount board according to (1), in which the water-absorption expansion material presses part of the base to displace two portions of the base sandwiching the missing portion relative to each other.

(3) The component mount board according to (2), in which the missing portion includes a first extending portion and a second extending portion extending in parallel with each other along a planar direction of the base, and the water-absorption expansion material is arranged at a location corresponding to a portion of the base between the first extending portion and the second extending portion, and presses the portion of the base.

(4) The component mount board according to (3), in which the missing portion includes a third extending portion extending from an intermediate portion of the first extending portion in a direction of extension thereof to an intermediate portion of the second extending portion in a direction of extension thereof.

(5) The component mount board according to (1), in which the water-absorption expansion material is arranged at a location corresponding to the second conductive pattern, and presses the second conductive pattern in the missing portion.

(6) The component mount board according to any one of (1) to (5), in which an expansion of the water-absorption expansion material in a first direction is greater than an expansion in a second direction perpendicular to the first direction, and the water-absorption expansion material is arranged such that the first direction is coincident with the direction perpendicular to the plane of the base.

(7) The component mount board according to (6), in which the water-absorption expansion material is formed in a sheet shape, and the first direction is a thickness direction of the water-absorption expansion material.

(8) The component mount board according to any one of (1) to (7), further including:

a water-conducting sheet arranged on an opposite side of the water-absorption expansion material from the moisture detection sensor.

LIST OF REFERENCE SIGNS

10 Board
11 Base
11*a* One Surface
11*b* Other Surface
111*a* Body Portion
111*b* Fixing Piece
12 Missing Portion
13*a* First Extending Portion
13*b* Second Extending Portion
14 Third Extending Portion
21 Soluble Layer
21*a* One Surface
21*b* Other Surface
30 First Conductive Pattern
31*a*, 31*b* Wide Portion
32*a*, 32*b* Narrow Portion
34*a*, 34*b*, 37*a*, 37*b*, 38*a*, 38*b*, 39*a*, 39*b* Annular Pattern Forming Portion
36 Coupling Portion
40 Second Conductive Pattern
41*a*, 41*b*, 42 Bridge Portion
50 Mount Component
60 Circuit
70, 71, 72 Water-Absorption Expansion Material
76 Spacer
77 Second Missing Portion
85 First Water Permeable Sheet
86 Water-Conducting Sheet
87 Second Water Permeable Sheet
90 Moisture Detection Sensor
91, 92 Double-Sided Tape
93, 94 Double-Sided Tape
100 Component Mount Board
300 Paper Diaper
301 Paper Diaper Body
302 Portion Corresponding to External Urethral Opening
310 Back Portion
310*a* Upper Edge
320 Front Portion
330 Coupling Portion
340 Hook-And-Loop Fastener Portion
350 Absorber

The invention claimed is:

1. A component mount board comprising:

a sheet-shaped moisture detection sensor, wherein the moisture detection sensor includes: a board having a base, a first conductive pattern formed on the base, and a mount component electrically connected to the first conductive pattern; and a second conductive pattern forming a circuit together with the first conductive pattern in a complementary manner, a portion of the base corresponding to the second conductive pattern is a missing portion, the component mount board further includes a water-absorption expansion material, and when expanding by water absorption, the water-absorption expansion material presses the base or the second conductive pattern in a direction perpendicular to a plane of the base to break the second conductive pattern.

2. The component mount board according to claim 1, wherein the water-absorption expansion material presses part of the base to displace two portions of the base sandwiching the missing portion relative to each other.

3. The component mount board according to claim 2, wherein the missing portion includes a first extending portion and a second extending portion extending in parallel with each other along a planar direction of the base, and the water-absorption expansion material is arranged at a location corresponding to a portion of the base between the first extending portion and the second extending portion, and presses the portion of the base.

4. The component mount board according to claim 3, wherein the missing portion includes a third extending portion extending from an intermediate portion of the first extending portion in a direction of extension thereof to an intermediate portion of the second extending portion in a direction of extension thereof.

5. The component mount board according to claim 1, wherein the water-absorption expansion material is arranged at a location corresponding to the second conductive pattern, and presses the second conductive pattern in the missing portion.

6. The component mount board according to claim 1, wherein an expansion of the water-absorption expansion material in a first direction is greater than an expansion in a second direction perpendicular to the first direction, and the water-absorption expansion material is arranged such that the first direction is coincident with the direction perpendicular to the plane of the base.

7. The component mount board according to claim 6, wherein the water-absorption expansion material is formed in a sheet shape, and the first direction is a thickness direction of the water-absorption expansion material.

8. The component mount board according to claim 1, further comprising:

a water-conducting sheet arranged on an opposite side of the water-absorption expansion material from the moisture detection sensor.

* * * * *